United States Patent [19]
Murphy et al.

[11] Patent Number: 5,545,308
[45] Date of Patent: Aug. 13, 1996

[54] METHOD OF USING CONDUCTIVE POLYMERS TO MANUFACTURE PRINTED CIRCUIT BOARDS

[75] Inventors: Oliver J. Murphy; G. Duncan Hitchens, both of Bryan; Dalibor Hodko, College Station; Eric T. Clarke, Bryan; David L. Miller, Austin; Donald L. Parker, Bryan, all of Tex.

[73] Assignee: Lynntech, Inc., College Station, Tex.

[21] Appl. No.: 491,625

[22] Filed: Jun. 19, 1995

[51] Int. Cl.[6] .................. C25D 5/02; C25D 5/54; C23C 28/00
[52] U.S. Cl. .................. 205/125; 205/159; 205/160; 205/162; 205/164; 205/183
[58] Field of Search .................. 205/118, 125, 205/159, 162, 163, 164, 165, 166, 183, 419, 423; 204/157.71

[56] References Cited

U.S. PATENT DOCUMENTS

| | | | |
|---|---|---|---|
| 5,106,473 | 4/1992 | Whitlaw et al. | 205/164 |
| 5,300,208 | 4/1994 | Angelopoulos et al. | 205/125 |
| 5,368,717 | 11/1994 | Gottesfeld et al. | 205/166 |

FOREIGN PATENT DOCUMENTS 1-293578 11/1989 Japan.

Primary Examiner—John Niebling
Assistant Examiner—Edna Wong
Attorney, Agent, or Firm—Jeffrey L. Streets; B. Todd Patterson

[57] ABSTRACT

The present invention provides electronically conducting polymer films formed from photosensitive formulations of pyrrole and an electron acceptor that have been selectively exposed to UV light, laser light, or electron beams. The formulations may include photoinitiators, flexibilizers, solvents and the like. These solutions can be used in applications including printed circuit boards and through-hole plating and enable direct metallization processes on non-conducting substrates. After forming the conductive polymer patterns, a printed wiring board can be formed by sensitizing the polymer with palladium and electrolytically depositing copper.

19 Claims, 9 Drawing Sheets

METHOD OF USING CONDUCTIVE POLYMERS TO MANUFACTURE PRINTED CIRCUIT BOARDS

It is to be noted that the U.S. government may have rights in the subject matter disclosed and claimed herein.

FIELD OF THE INVENTION

The present invention relates to conductive polymers and their use in electronic applications. More particularly, the present invention relates to the preparation of polypyrrole and its use in preparing printed circuit boards and through hole plating. Even more particularly, the present invention relates to photosensitive solutions of pyrrole and direct metallization processes for preparing electronic circuits on non-conducting substrates.

BACKGROUND OF THE DISCLOSURE

The trend toward miniaturization, integration and automated assembly in the electronics industry is forcing designers to continually increase the component density in integrated circuit manufacturing, interconnection and packaging. Current demand for increasingly complex PWBs has resulted in increasingly stringent requirements for all production steps. To produce high-quality boards at competitive prices means keeping production costs down. This in turn means less consumption of environmentally toxic chemicals, reduced number of manufacturing steps, shorter process times, and a greater need for automation.

The introduction of double-sided, followed by multilayer boards, was achieved by metallization of plated through-holes with electroless copper. For the last 25 years, 98 percent of the PWBs manufactured used this technology. However, electroless deposition of copper requires a potent reducing agent, such as formaldehyde—a reported carcinogen. Most electroless copper solutions contain cyanide and chelating agents, which are difficult to remove from waste streams. Besides the normal drag-out associated with wet processing, "bail-out" (required to maintain solution balance and periodic bath changes) renders waste treatment of electroless copper far more expensive than electroplated copper. Stripping copper from racks and tanks with nitric acid is another environmental and waste treatment concern associated with electroless copper.

In the conventional subtractive plated-through-hole (PTH) process, copper foil is laminated onto an insulating substrate (typically polyimide, epoxy-fiberglass, etc.). Holes are drilled through the copper-clad laminate to allow insertion of components. Then the typical smear and etch-back process uses an alkaline permanganate solution followed by a hydrofluoric acid solution to remove resin smear and glass fibers from the walls of the holes in preparation for the plating process.

In the conventional process a seed or catalyst, usually a noble metal salt, is then applied to the circuit board. Next, by means of electroless copper deposition about 10–20 microns of copper is deposited on the surfaces of through-hole walls, providing electrical continuity from one side of the panel to the other. Electroless copper deposition is a seven-step process with interval rinses with water that become contaminated with copper sulfate/EDTA/formaldehyde bath components. Following electroless copper deposition, copper is electrodeposited over the entire board surface and sensitized walls of through-holes, usually to a thickness of 0.001 in.

A negative-, or plating-resist, pattern is then applied and registered to both sides of the material. Resist covers all areas of the foil where base copper conductor is not required, and the surplus conductor will subsequently be etched off. The panels are imaged in preparation for the actual circuitry pattern by a conventional photolithographic process. In this process photoresist is applied as a thin film to the substrate and is subsequently exposed in an image-wise fashion through a photomask. The mask (Mylar) is then removed. The areas in the photoresist that are exposed to light are made either soluble or insoluble in a specific solvent termed a developer. In the case of a negative resist, the non-irradiated regions are dissolved leaving a negative image. This is achieved in the development process.

The next plating step is to electrodeposit copper and a thin layer of a suitable etch-resist plating, usually solder or gold. The original plating resist, screen or photoresist, is removed, and the circuit pattern is defined by etching away exposed copper in a suitable etchant (e.g. ammonium persulfate). During this process, 90% of the copper plating is removed by etching, thus producing large volumes of sludge and rinse water.

Recently, the U.S. Environmental Protection Agency's Waste Reduction Innovative Technology Evaluation (WRITE) Program has been established in the printed wiring board manufacturing industry in order to perform technical and economic evaluations of the volumes and/or toxicity of wastes produced from the manufacture, processing and use of materials. Environmental concerns associated with electroless copper metallization, have fostered interest in direct metallization processes. Despite numerous attempts over the last 10 years, conversion to a direct metallization process has not gained widespread acceptance, and only about five percent of PWB manufacturers worldwide have eliminated metallization by electroless copper.

In addition to the environmental concerns about electroless copper metallization, circuit board manufacture using this process can require as many as 15 to 20 steps (including rinses), involving 70 minutes of processing time. This obviously creates a roadblock for achieving a flee-flowing process. Electronics manufacturers have not realized or appreciated the benefits that direct metallization can provide. These include reduced waste treatment/processing costs, lower chemical costs, improved efficiency/reliability, and the elimination of a time-consuming procedure.

Electronically conducting polymers have often been categorized as non-processable and intractable, because of their insolubility in the conducting form. Only recently has it been shown that polymers such as polyaniline can be dissolved using functionalized sulfonic acids. For polypyrrole, this can be achieved by using its derivatives [e.g., poly (3-octylpyrrole)] which are known to be soluble in different solvents, or by treatment in dilute aqueous sodium hypochlorite solutions, ammonia or mono-, di- or tri-substituted amine (co)solvents. Another method of solubilizing polypyrrole is the process of polypyrrole chain deprotonation in basic solutions, which causes a transformation of conducting polypyrrole into a non-conducting polymer of quinoid structure.

The lack of processability of conducting polymer materials, e.g., solution or melt processing, infusability and poor mechanical properties, e.g., ductility, have slowed down their emerging commercial applications. While electrochemical preparation of conducting polymers has been shown to be the most satisfactory process from the viewpoint of fundamental investigations, it is likely to be inappropriate for the large-scale industrial production of bulk quantities of these materials. This is particularly true where large molecular entities, e.g., copolymers or different additives, need to be incorporated into conducting polymer matrices in order to obtain tailored performance characteristics.

In order to compete with more-advanced interconnect systems, such as hybrid circuits and multichip modules (MCMs), future PWBs will have to be designed so that their size and cost advantages can be used to find a wider range of applications. This will require PWBs with increased conductor density. To accomplish this, finer lines and spaces (<5 mils), smaller vias (<12 mils), thinner multilayer boards (<0.032 in), and improved insulation resistance will be necessary. Finer lines and pitch will require high-resolution imaging and precision etching. The presence of plated-through-holes (PTHs 0.062–0.04 in) and vias (<0.10 in) in ever-increasing numbers, will present a challenge in laminating, drilling and metallization.

Consequently, there remains a need for improved direct metallization processes for preparing electronic circuits on non-conducting substrates. It would be desirable to have a direct metalization process that avoids polymer solubility problems, can easily incorporate additives, does not depend upon electroless-copper plating, minimizes hazardous chemicals and copper plating solutions, requires fewer process steps, provides simplified through-hole metallization, and facilitates increased conductor densities.

SUMMARY OF THE INVENTION

The present invention provides a method for forming an electronically conducting polymer on a substrate comprising the steps of forming a solution comprising a pyrrole monomer and an electron acceptor, wherein the molar ratio of pyrrole:electron acceptor is between about 0.5 and about 20; applying a film of the solution onto a substrate; photopolymerizing portions of the film to form electronically conducting polypyrrole; and optionally washing the unpolymerized portion of the film from the substrate and activating the polypyrrole with palladium bromide. The substrate may be either conducting or nonconducting and either rigid or flexible.

The electron acceptor is selected from the group consisting of silver salts, e.g., $AgNO_3$, $AgClO_4$ and $AgNO_2$, with the most preferred being $AgNO_3$. The solution may further comprise a photoinitiator, another monomer such as aniline, a flexibilizer selected from the group consisting of polyethylene glycol diglycidyl ether, dodecyl sulfate and dodecylbenzene sulfonate.

The invention further includes a method of forming an electronic circuit on a substrate comprising the steps of forming a solution comprising a pyrrole monomer and an electron acceptor; applying a film of the solution onto the substrate; photopolymerizing portions of the film to form electronically conducting polypyrrole; washing the unpolymerized portion of the film from the substrate; activating the polypyrrole with aqueous palladium bromide; and electrodepositing copper onto the activated polypyrrole. This method is particularly well suited to direct metallization of printed wiring boards having through-holes in very few steps.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

DETAILED DESCRIPTION OF THE PREFERRED EMBODIMENT

Figure 1:
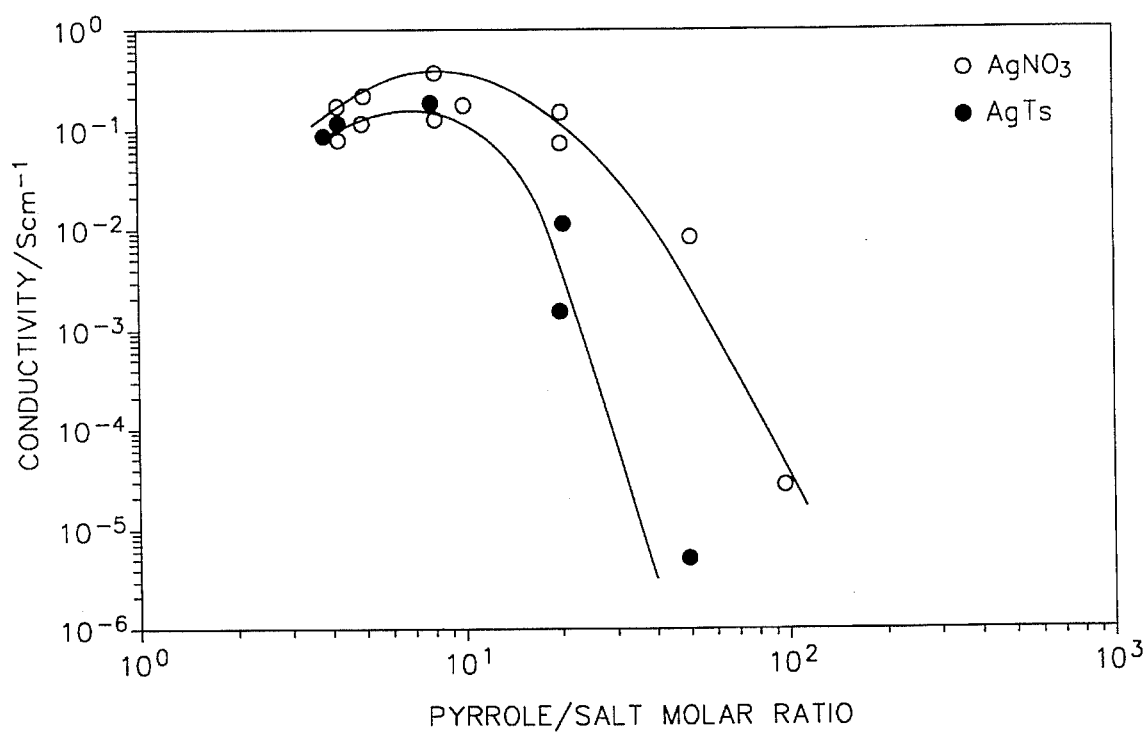
FIG. 1 is a graph illustrating the dependence of conductivity on the type and concentration of dopant anions present in photopolymerizable pyrrole-based formulations.

The present invention provides a novel process for using conducting polymers for direct metallization of nonconducting surfaces which is capable of metallizing both PWB conductor lines and through-holes. The process is highly compatible with lithographic processes used in manufacturing PWBs. The proposed process satisfies the criteria required for designing future PWBs: (a) environmentally conscious manufacturing, and (b) high-resolution conductor line imaging.

The formulations of the present invention include a salt that serves both as an electron acceptor for oxidation of the monomer(s) and as a dopant to preserve electroneutrality in the oxidized polymer. Preferred electron acceptors undergo very slow oxidation of the monomer in the dark (1–2 days) and have the highest conductivities.

Polypyrrole (PPY) can be chemically prepared using inorganic ($Fe^{3+}$ and $Cu^{2+}$ ions) or organic (chloranil) electron acceptors. When these inorganic acceptors are added to pyrrole-containing solutions a powdery polymer material results almost immediately after the addition. Therefore, cations having too high an oxidation potential are not suitable for photopolymerization of polypyrrole. Several attempts were made to use organic electron acceptors, but photopolymerization of black conductive PPY films was unsuccessful. It has been shown that electron acceptors with proper oxidation potential (e.g. $Ag^+$, $Fe^{3+}$ or $Cu^{2+}$ ions) and dopant (e.g. $NO_3^-$, $BF_4^-$, tosylate, etc.) play a decisive role in determining the conductivity of the conducting polymer film. The preferred electron acceptors are the silver salts (such as $AgNO_3$, $AgClO_4$ and $AgNO_2$), with the most preferred being silver nitrate, $AgNO_3$.

Molar ratios of monomer to electron acceptor ranging between about 2 and about 100 are effective for producing electronically conductive polymer films. However, the electrical conductivity of the polymers decreases with decreasing concentration of electron acceptor (increasing monomer to electron acceptor ratio).

A polymer network can be formed by promoting the polymerization of a monomer, oligomer, or mixtures of monomers and/or oligomers. Polymerization is a chain reaction that can develop very rapidly, especially when intense UV radiation is used to produce the initiating species. This UV-curing reaction leads ultimately to a three-dimensional polymer network. Since most of the monomers or oligomers commonly employed do not produce initiating species with a sufficiently high yield upon UV exposure, it is preferred to introduce a photoinitiator that will allow the polymerization to start. A typical UV-curable formulation, therefore, will contain two basic components: (i) a photoinitiator, and (ii) a monomer, oligomer, or a mixture of monomers and/or oligomers.

The choice of the photoinitiator is of prime importance in light-induced polymerizations, since it directly governs the cure rate. A suitable photoinitiator system must possess high absorption in the emission range of the light source. The photoinitiator must also form an excited state having a short lifetime to avoid quenching by oxygen or the monomer and split into reactive radicals or ionic species with the highest possible quantum yield. Other factors to be considered in selecting the proper photoinitiator include solubility in the monomer, storage stability and the nature of the photoproducts, which should not be colored, toxic or induce some degradation of the polymer upon aging. Photoinitiators can be classified into three major categories, depending on the kind of mechanism involved in their photolysis: (i) radical formation by photo-cleavage; (ii) radical generation by hydrogen abstraction, and (iii) cationic photoinitiators.

Cationic photoinitiators have proven to be particularly useful in the photopolymerization of polypyrrole from pyrrole monomers in solution. Besides their specificity, cationic-initiated photopolymerizations have the advantage of being insensitive to atmospheric oxygen. In the absence of nucleophilic reagents, the chain reaction will thus continue to develop after the illumination has ceased and provide a beneficial post-cure effect that can be enhanced by thermal treatment. The preferred post-photopolymerization thermal treatment involves heating the polymer at temperatures between about 80 and about 120 degrees Celsius for about three hours, with the most preferred temperature being about 100 degrees Celsius.

Thermally stable photoinitiators for cationic polymerizations of commercial significance include the onium salts, such as triarylsulfonium and diaryliodonium, with complex metal halide anions. A key feature of these photoinitiators is the low nucleophilicity of the anions which reduces termination processes and allows ambient temperature cationic polymerization to proceed. The absence of air inhibition represents a distinguishing feature of cationic, as compared to radical, polymerization.

The photoinitiators investigated included a titanocene radical photoinitiator (such as IRGACURE™ 784 available from Ciba Geigy, located in Ardsley, N.Y.), a cationic ferrocinium photoinitiator (IRGACURE™ 261 available from Ciba Geigy, located in Ardsley, N.Y.), triaryl sulphonium $PF_6^-$ salts (such as CYRACURE™ 6990, available from Union Carbide, located in Danbury, Conn.), triaryl sulphonium $SbF_6^-$ salts (such as CYRACURE™ 6974, available from Union Carbide, located in Danbury, Conn.). The photoinitiators are preferrably added to the monomer in amounts less than about 8 weight percent, with the most preferred amounts being between about 0.2 to about 0.8 weight percent.

Photopolymerization of pyrrole alone, or pyrrole mixed with a photoinitiator such as titanocene, yields a transparent yellow film exhibiting insulating properties. Resistances of over 20 MΩ are measured by an ohmeter. When $AgNO_3$, an electron acceptor, is dissolved into the pyrrole prior to curing, a black polymer film characteristic of conducting polypyrrole is formed.

In general, both electropolymerized and photopolymerized polypyrrole films suffer from poor mechanical properties. They lack flexibility, either as stand alone films or as coatings. Three approaches have been found to improve the mechanical properties of photopolymerized polypyrrole: (i) incorporating large amphiphilic (surfactant) organic,anions into the polypyrrole structure, (ii) photo-copolymerizing a suitable comonomer material with pyrrole, and (iii) including commercial flexibilizers. The preferred surfactants are large anionic surfactants, such as the sodium salts of dodecyl sulfate (DDS) and dodecylbenzene sulfonate (DDBS). The preferred comonomer is aniline. The preferred flexibilizer is polyethylene glycol diglycidyl ether.

In accordance with the present invention, formulations can include a mixture of monomers which can be photopolymerized to form copolymers. While photo-copolymerizations can be achieved with many monomer pairings, the preferred monomer pairs for the lithographic production of an electronically conducting copolymer on a non-conducting substrate are comprised of: (i) pyrrole in combination with: (ii) a sub-stoichiometric amount of silver nitrate (molar ratio of pyrrole to silver nitrate is 8:1) and with (iii) fifteen mole percent aniline relative to pyrrole. The mixed monomer formulation is then diluted with an equivalent volume of acetonitrile to provide good contact with the substrate.

The components of photopolymerizable solutions are mixed in a glass vial that excludes the penetration of light. The solutions are then sonicated to help dissolution and homogenization of the formulation. Since a slow chemical polymerization of pyrrole takes place over a period of one to two days in the presence of $Ag^+$ ions, it is preferred that fresh photopolymerizable formulations be prepared immediately prior to polymerization.

A thin layer of the formulation is then cast and evenly spread on the surface of a selected substrate typically having a surface area of between about 1 and about 4 square centimeters ($cm^2$). The preferred methods of spreading the formulation over the substrate to achieve a thin layer having uniform thickness include brush coating, spraying, dipping and spin coating, with the most preferred method being spin coating.

After casting of the photopolymerizable solution onto a substrate and formation of an air-dried nonconducting film, the oxidation process is initiated by irradiation. The preferred irradiation methods are those which selectively expose only discrete regions or lines on the coated substrate, such as exposure by ultraviolet light through a contact mask, direct laser imaging, or electron beam imaging. Using these methods, thin polymer patterns (lines and through-holes) are readily polymerized on various conducting and nonconducting substrates. Multiple coating-curing cycles (up to 10 layers) can be carried out in order to produce thick uniform films.

Photopolymerizations according to the present invention can be accomplished with a 200-watt mercury-xenon lamp focused through a lens vertically downward onto a circular area of less than one centimeter diameter. All the optical accessories should be made of fused silica in order to pass high energy UV as well as visible light.

The present invention uses irradiation as the driving force to induce electron transfer from the monomer species in a cast solution film to the electron acceptor, also present in the formulation. As the concentration of oxidized polymer increases, coupling between the oxidized monomer units begins. This process continues, resulting in growth of the conducting polymer chains. Since the polymer is oxidized, the anion present in the formulation intercalates into the polymer, maintaining electroneutrality.

The photopolymerization process does not require a conducting substrate for deposition to take place, and conducting polymer films and/or lines of various thickness, typically between about 5 and about 300 microns can be readily photopolymerized on typical PWB substrates (fiberglass/epoxy, polyimide) and MCM (alumina) as well as on metals, ceramic, silicon, GaAs, glass, paper, Teflon, Mylar and polystyrene substrates. The process of the present invention is much simpler than techniques known in the art and offers a high potential and flexibility for adaptation to a variety of PWB technologies.

The photopolymerization process of the invention includes the following steps:
(i) a photopolymerizable formulation is applied on a substrate;
(ii) after air-drying, a dry negative prepolymer film is exposed to laser light, an electron beam or to a UV lamp through a shadow mask;
(iii) the illumination induces photopolymerization of the prepolymer film at exposed areas rendering the exposed areas insoluble; and
(iv) the non-polymerized (non-illuminated) areas are washed off with an environmentally benign solvent (acetone) or water, leaving a pattern of conducting polymer lines.

The main advantage of the photopolymerization process, compared to electrochemical and/or chemical polymerizations, is that it allows properties of conducting polymer films to be easily designed and optimized by incorporating molecular species into the polymer structure. For example, it is possible to change the conductivity of the polymer by controlling the amount of the electron acceptor and dopant anions present in the formulations. The same oxidatively coupled cationic polymer is formed through photopolymerization as through electrochemical polymerization, except that the anion/monomer ratio is much higher (1:1.3) compared to that found in electrochemically formed films (1:4). This is a desirable feature because with more anions in the polymer matrix, more charge can be introduced onto the polymer chains and, consequently, higher conductivities may be achieved.

EXAMPLE 1

A separate investigation involving both photopolymerization and thermal polymerization processes was performed on samples having two different electron acceptor salts, $AgNO_3$ and AgTs, at rather low concentrations (pyrrole:electron acceptor=50:1). Four samples were cured at the same time either thermally or by photopolymerization. Curing times were determined by observing the solidification of the surface and by applying a simple pencil hardness test, often used in the polymer coating industry for semiquantitative determination of curing quality. The results are summarized in Table 1.

Thermally cured polymer films, either with $AgNO_3$ or AgTs as electron acceptor, were of very poor quality, rough and lacked a uniform color, indicating nonhomogeneous polypyrrole films. Thermal curing of the first layer proceeded with incomplete coverage of the exposed substrate surface and curing resembled that of simple drying of the solution. On the other hand photopolymerization of the first layer resulted in a completely covered substrate surface. When more layers were added, curing times became longer, because of the penetration of freshly added formulation into the existing layers. Curing times for films where silver tosylate was added as the electron acceptor salt were longer than for $AgNO_3$-containing samples. This was expected, because diffusion of larger (organic) anions into polymer films being formed (in order to satisfy the neutrality of an oxidized polymer) is much slower than for smaller anions, like nitrates. Thermal curing, required 2–3 times longer curing times than the process of photopolymerization. This is evident especially where tosylates are used as electron acceptors.

TABLE 1

COMPARISON OF PHOTOPOLYMERIZED AND THERMALLY POLYMERIZED POLYPYRROLE FILMS
(PYRROLE/ELECTRON ACCEPTOR MOLAR RATIO WAS 50:1; PHOTOINITIATOR: 3 wt % IRGACURE 261)

| LAYER NUMBER | ELECTRON ACCEPTOR | $AgNO_3$ | | AgTs | |
| --- | --- | --- | --- | --- | --- |
| | | PHOTO-POLYMERIZED | THERMALLY POLYMERIZED | PHOTO-POLYMERIZED | THERMALLY POLYMERIZED |
| FIRST LAYER | CURE TEMPERATURE °C. | 68 | 69 | 68 | 69 |
| | CURING TIME min | 2 | 3.5 | 3 | 18 |
| | POLYMER FILM APPEARANCE | Smooth, black, brittle | incomplete coverage, gray-black, rough, brittle | smooth, green-black, brittle | incomplete coverage, gray-green black, rough, brittle |
| FIFTH | CONDUCTIVITY | $9.7 \times 10^{-3}$ | $3.8 \times 10^{-2}$ | $4.1 \times 10^{-4}$ | $6.0 \times 10^{-5}$ |

TABLE 1-continued

COMPARISON OF PHOTOPOLYMERIZED AND THERMALLY POLYMERIZED POLYPYRROLE FILMS
(PYRROLE/ELECTRON ACCEPTOR MOLAR RATIO WAS 50:1; PHOTOINITIATOR: 3 wt % IRGACURE 261)

| | | AgNO₃ | | AgTs | |
|---|---|---|---|---|---|
| LAYER NUMBER | ELECTRON ACCEPTOR | PHOTO-POLYMERIZED | THERMALLY POLYMERIZED | PHOTO-POLYMERIZED | THERMALLY POLYMERIZED |
| LAYER | $S\ cm^{-1}$ CURE TEMPERATURE °C. | 68 | 68 | 67 | 68 |
| | CURING TIME min | 7 | 8 | 9 | 20 |
| | POLYMER FILM APPEARANCE | smooth, black, brittle | gray-white-black, rough, brittle | smooth, green-black, brittle | gray-white-black, rough, brittle |

From the results of this experiment it is evident that the photochemical polymerization process proceeds faster than thermal polymerization and produces more smooth and uniform polypyrrole films. The thermal polymerization process is obviously different in nature, possibly based on a chemical polymerization mechanism at elevated temperatures, leading to the formation of a partially silver-filled non-conducting polypyrrole matrix.

EXAMPLE 2

In order to improve the mechanical properties of PPY films three different electron acceptor salts were investigated: $AgNO_3$, AgTs and $AgBF_4$. It has been reported that incorporation of tosylate anions improves the mechanical properties of electrochemically formed PPY films. Thus, these three electron acceptor salts were added to photopolymerizable formulations using pyrrole: acceptor molar ratios ranging from 100:1 to 4:1, the latter being closest to the ratio of pyrrole monomer to positive charge found in electrochemically polymerized films. FIG. 1 shows the dependence of electrical conductivity on the concentration of electron acceptors ($AgNO_3$ and AgTs) added to the formulations. Both curves exhibit a maximum conductivity value of approximately 0.1–0.3 $S\ cm^{-1}$ at pyrrole: salt molar ratios between about 3:1 and about 8:1. A steep decrease in conductivity occurred at molar ratios higher than 15:1. In the case of AgTs, at low added salt concentrations, the conductivities were several orders of magnitude lower than those for polymer films photopolymerized with $AgNO_3$. The data shown in FIG. 1 includes films of different thicknesses, where all of them were photopolymerized and then peeled off from Al substrates. Although the thinner films were less brittle and less fragile, no improvement in mechanical properties was observed for films photopolymerized with tosylates.

In experiments performed involving different substrates it was found that comparisons between photopolymerized polypyrrole films were best achieved if polystyrene was used as the substrate, and if the films under investigation were cured at the same time, which assured the same curing conditions. Polystyrene showed satisfactory wettability for a whole range of film compositions used.

In Table 2 results are given for PPY films photopolymerized using different silver salts, and their mixtures, added at pyrrole:salt molar ratios of 8:1. All the films yielded conductivity values within an order of magnitude of each other (approximately 0.1 to 0.4 $S\ cm^{-1}$), except in the case of $AgBF_4$ which displayed a conductivity value two orders of magnitude lower. $AgBF_4$-containing films possessed the poorest mechanical properties, and required the longest curing times for complete curing. When mixed with $AgNO_3$ in equimolar concentrations, but keeping the total pyrrole/salt ratio constant (8:1), the conductivity of polypyrrole films improved and approached the values measured for $AgNO_3$ alone.

From the data presented in FIG. 1 and Table 2, it was concluded that $AgNO_3$ added to photopolymerizable formulations in amounts corresponding to 10–15 mol %, provide the necessary electron acceptor properties for photopolymerization to take place, and gives the amount of $NO_3^-$ anions required for charge balance inside the polymer. Thus, $AgNO_3$ is the optimal choice of electron acceptor for the photopolymerization of pyrrole.

TABLE 2

CONDUCTIVITY OF PHOTOPOLYMERIZED PPY FILMS CONTAINING
DIFFERENT ANIONS (ELECTRON ACCEPTOR: $Ag^+$; PHOTOINITIATOR: 3
wt % IRGACURE 261; PYRROLE/SALT RATIO = 8:1).

| ELECTRON ACCEPTOR SALT | STAND ALONE FILMS | | FILMS ON POLYSTYRENE | |
|---|---|---|---|---|
| | CONDUCTIVITY $S\ cm^{-1}$ | THICKNESS mm | CONDUCTIVITY $S\ cm^{-1}$ | THICKNESS mm |
| $AgNO_3$ | 0.425 | 62 | 0.158 | 34 |
| AgTs | 0.197 | 88 | 0.179 | 53 |

TABLE 2-continued

CONDUCTIVITY OF PHOTOPOLYMERIZED PPY FILMS CONTAINING DIFFERENT ANIONS (ELECTRON ACCEPTOR: $Ag^+$; PHOTOINITIATOR: 3 wt % IRGACURE 261; PYRROLE/SALT RATIO = 8:1).

| ELECTRON | STAND ALONE FILMS | | FILMS ON POLYSTYRENE | |
|---|---|---|---|---|
| ACCEPTOR SALT | CONDUCTIVITY S cm$^{-1}$ | THICKNESS mm | CONDUCTIVITY S cm$^{-1}$ | THICKNESS mm |
| $AgBF_4$ | | | 0.0018 | 57 |
| $AgNO_3\backslash AgTs$ | 0.212 | 168 | | |
| $AgNO_3\backslash AgBF_4$ | 0.375 | 51 | | |

EXAMPLE 3

Figure 2:
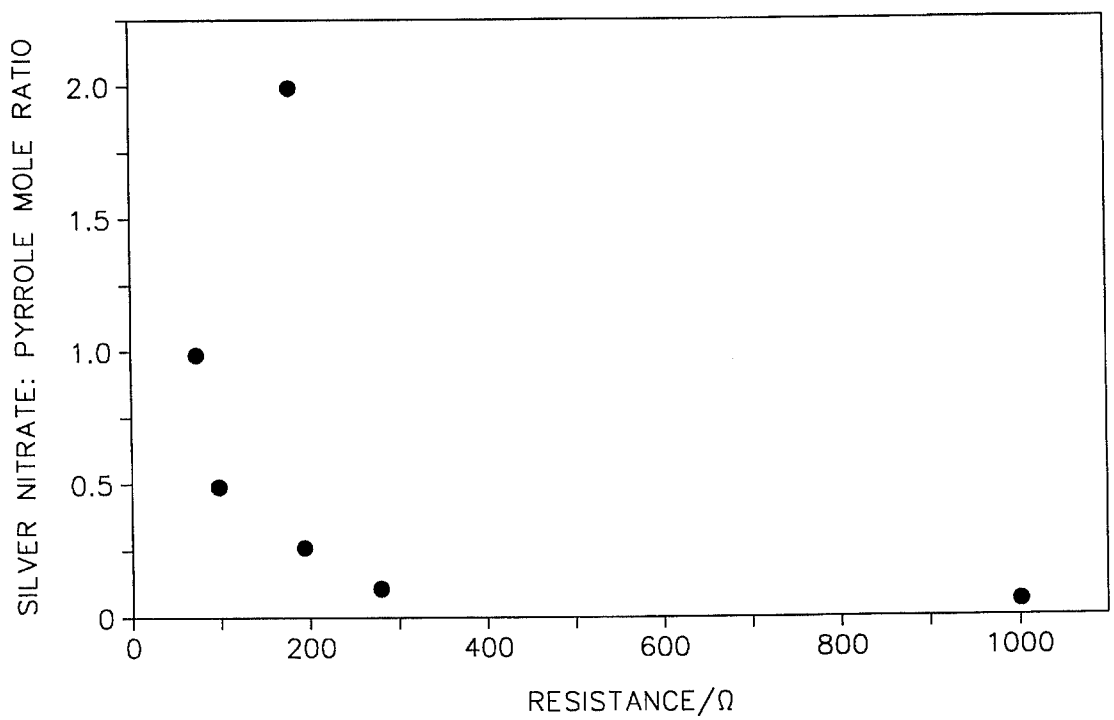
FIG. 2 is a graph illustrating the dependence of electrical resistance of photopolymerized polypyrrole films on the electron acceptor:monomer mole ratio in the starting formulation.

A series of experiments were performed to examine the electrical resistance of photopolymerized polypyrrole films as a function of monomer/electron acceptor mole ratio in the starting formulation. A mole ratio range of 20:1 to 0.5:1 (pyrrole:silver nitrate) was investigated. The solutions were prepared in one ml of pyrrole monomer and varying amounts of silver nitrate. Pyrrole films of constant thickness (ca. 60 microns) were produced. A minimum in resistance (Van der Pauw method) of ca. 80 Ω was observed at a 1:1 mole ratio of monomer to silver nitrate. Results shown in FIG. 2 demonstrate that by simple adjustment of the concentration of starting formulation components (monomer and electron acceptor) an order of magnitude change in resistance could be obtained.

EXAMPLE 4

Simple tests of thick film curing were performed by simultaneous illumination of formulations containing photoinitiators added at 3 wt % to an 8:1, pyrrole:AgNO$_3$ solution. Exposure to UV light was brought about from the top of miniature glass vials (0.7 cm dia. and 1.1 cm height) containing different photoinitiators. The process of photopolymerization was closely followed under low illumination conditions (corresponding to a temperature of 30°–32° C.), in order to determine the changes taking place during photopolymerization. In all four vials the polymerization process went through different stages which affected the color of the bulk and/or surface layers of the formulations and the speed of solidification. From this simple experiment it was observed that cationic photoinitiators exhibited faster curing rates than radical photoinitiators. Especially, Irgacure 261 demonstrated better curing (in line with weak absorption of 366 nm light), as evidenced by a deeper and more homogeneous blackening and solidification of the entire formulation volume in the glass vial.

Although the choice of photoinitiator between triarylsulfonium salts and the ferrocinium photoinitiator, all three being cationic photoinitiators, was not conclusive, the ferrocinium photoinitiator is more suitable for photopolymerization of pyrrole because it allows deeper light penetration through the black solidified surface layer. Ferrocinium photoinitiators have been found to be successful for the photopolymerization of epoxides, which have been used in this work as potential copolymers with polypyrrole (see later).

Figure 3:
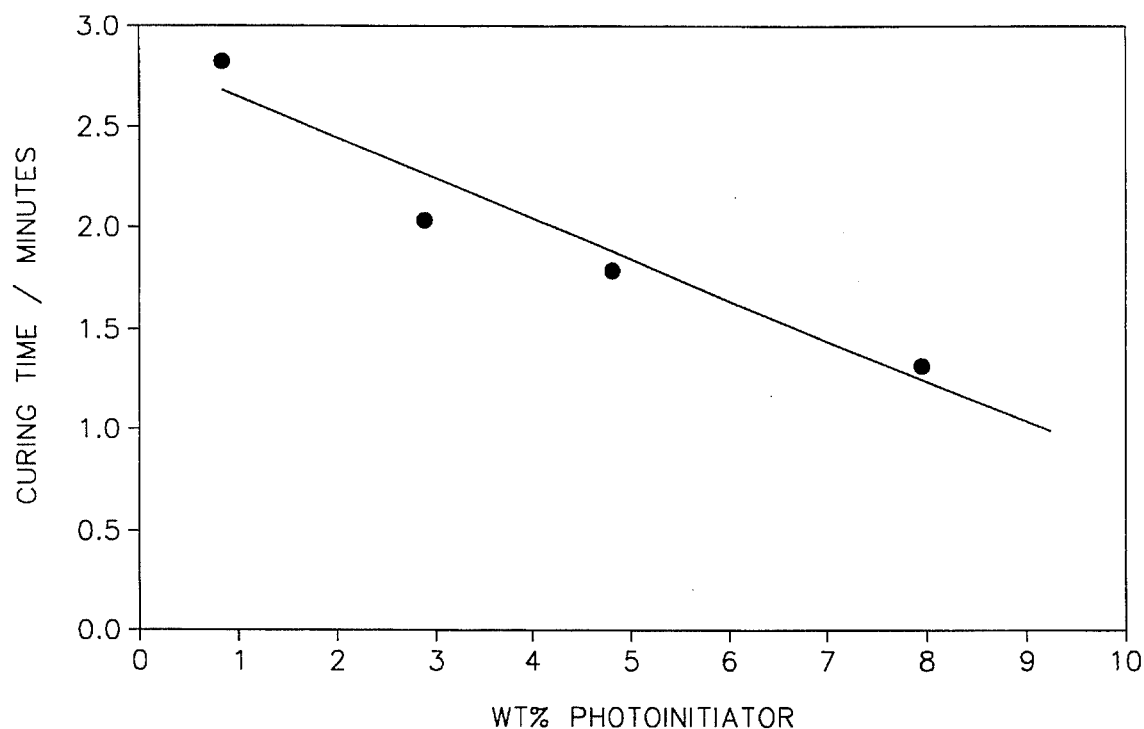
FIG. 3 is a graph illustrating the dependence of curing time on the concentration of photoinitiator.
Figure 4:
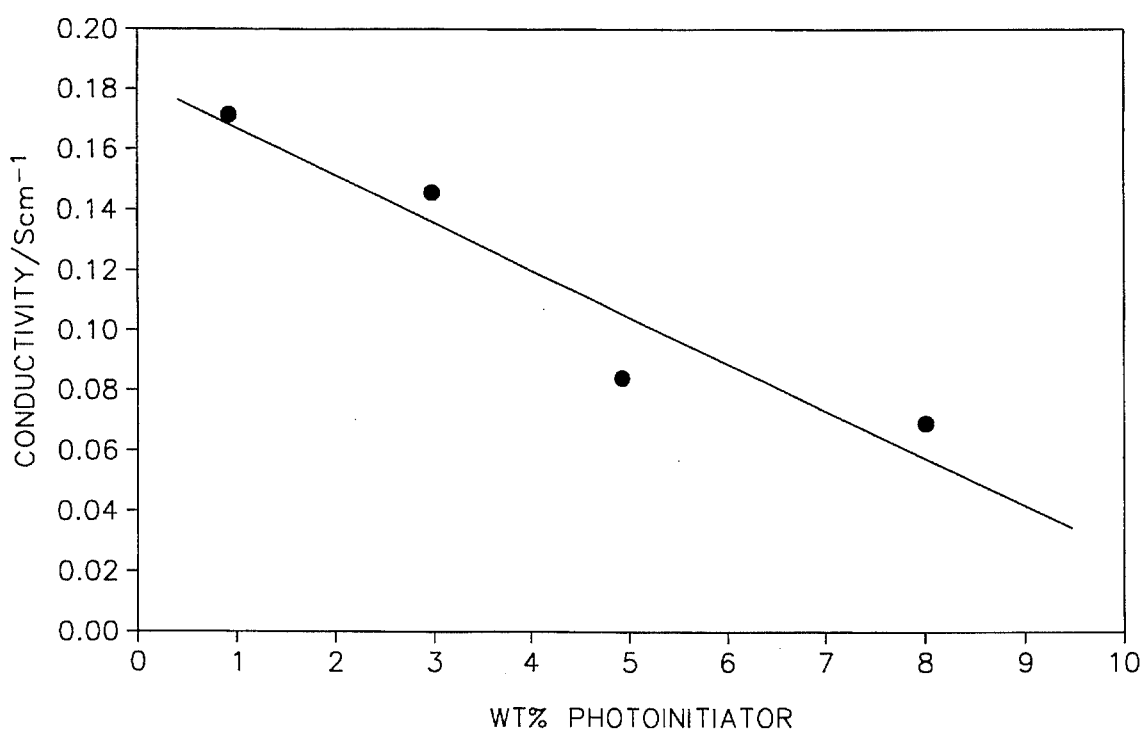
FIG. 4 is a graph illustrating the dependence of conductivity on photoinitiator concentration.

The effect of ferrocinium photoinitiator concentration on the curing time of PPY films is shown in FIG. 3. Formulations containing increasing amounts of photoinitiator were applied at different thicknesses on Al and glass substrates, and were cured simultaneously. Curing time was determined by observing solidification and by the pencil hardness test. Increasing the amount of photoinitiator from 1 to 8 wt % decreased the curing time by approximately a factor of two. FIG. 4 shows that increasing amounts of photoinitiator present in the films causes a slight decrease in conductivity.

EXAMPLE 5

Organic anions chosen were DDS (dodecyl sulfate, sodium salt) and DDBS (dodecylbenzene sulfonate, sodium salt). They were added to the already optimized formulation to yield the highest conductivity, i.e., pyrrole:AgNO$_3$ ratio of 8:1 and 3 wt % of Irgacure 261 photoinitiator. Amounts added to the formulation are expressed as pyrrole/surfactant molar ratios. Polypyrrole films where photopolymerized from these formulations under different illumination conditions and on various substrates. A postcure thermal treatment at the highest lamp irradiance was applied after photocuring. This is recommended by Ciba-Geigy for completion of curing processes when Irgacure 261 photoinitiator is used.

Photopolymerization along the area of the substrate covered by the formulation was followed by observing black solidifying zones smoothly spreading on the substrate. It was evident that these additives helped diffusion of polymerizing components in the thin formulation layer. Curing was generally slower than for the films without surfactant additives. Films obtained showed a significant improvement in mechanical properties. They were very flexible compared to the films that did not contain surfactant additives. It was possible to bend these films, whether coated on an aluminum sheet or on polystyrene, through angles greater than 90° without breaking them. Additives acting as surfactants greatly improved the adherence to the substrate. More importantly, films thus formulated retained good conductivity. DDBS was less soluble in pyrrole and gave rise to films of lower flexibility when compared to films with DDS as additive. Table 3 compares conductivities for DDS- and DDBS-containing films, added to pyrrole:surfactant molar ratios of 15:1.

TABLE 3

CONDUCTIVITY OF PHOTOPOLYMERIZED PPY FILMS WITH LARGE
ORGANIC ANIONS AS FLEXIBILIZERS (PYRROLE/AgNO$_3$ = 8:1;
PYRROLE/SURFACTANT = 15:1; PHOTOINITIATOR: 3 wt % IRGACURE 261;
CURING TIME: FAST, 1.9 W cm$^{-2}$ WITH THERMAL POSTCURE: 2.3 W cm$^{-2}$).

| ADDITIVE | DDS | | DDBS | |
|---|---|---|---|---|
| SUBSTRATE MATERIAL | CONDUCTIVITY S cm$^{-1}$ | THICKNESS mm | CONDUCTIVITY S cm$^{-1}$ | THICKNESS mm |
| STAND ALONE | 0.21 | 163 | 0.20 | 215 |
| STAND ALONE | 0.51 | 61 | 0.59 | 75 |
| STAND ALONE PY/AgNO$_3$ = 5/1 | 0.134 | 224 | | |
| POLYSTYRENE | 0.48 | 39 | 0.32 | 62 |
| POLYMER FILM APPEARANCE | smooth, black, curing time: 1.3 min/layer, very flexible | | smooth, black, curing time: 2 min/layer, flexible | |

Figure 5:
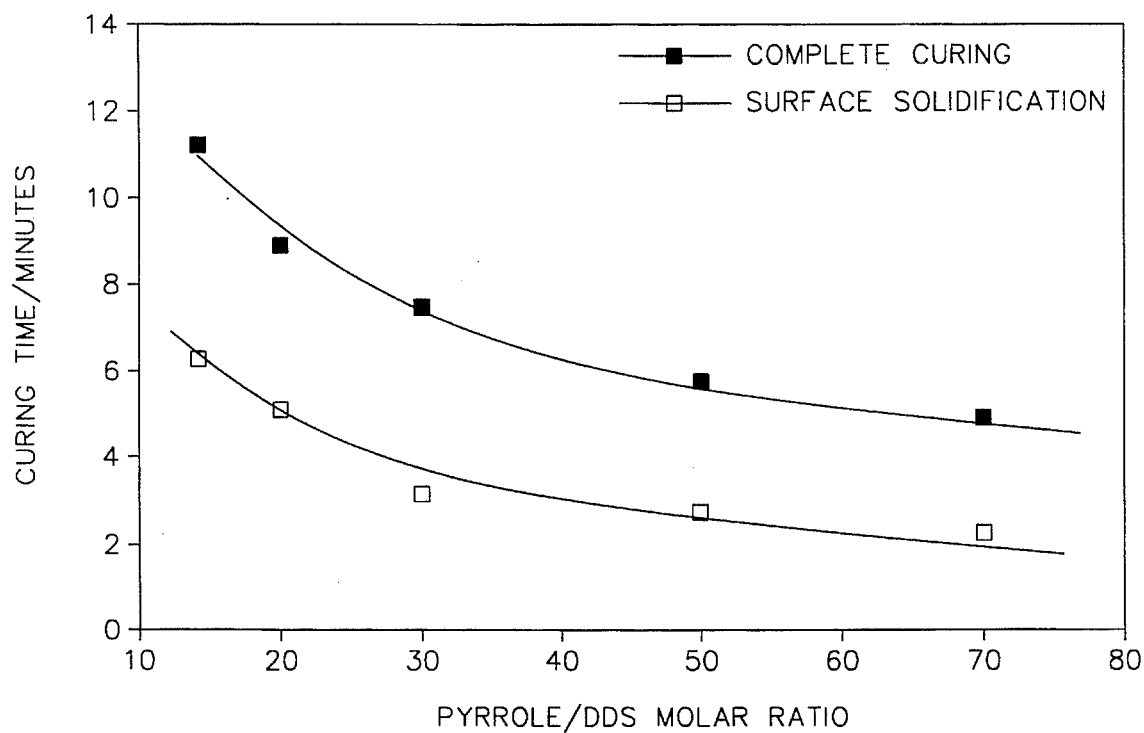
FIG. 5 is a graph illustrating the dependence of curing time on the amount of dodecyl sulfate used as flexibilizer.
Figure 6:
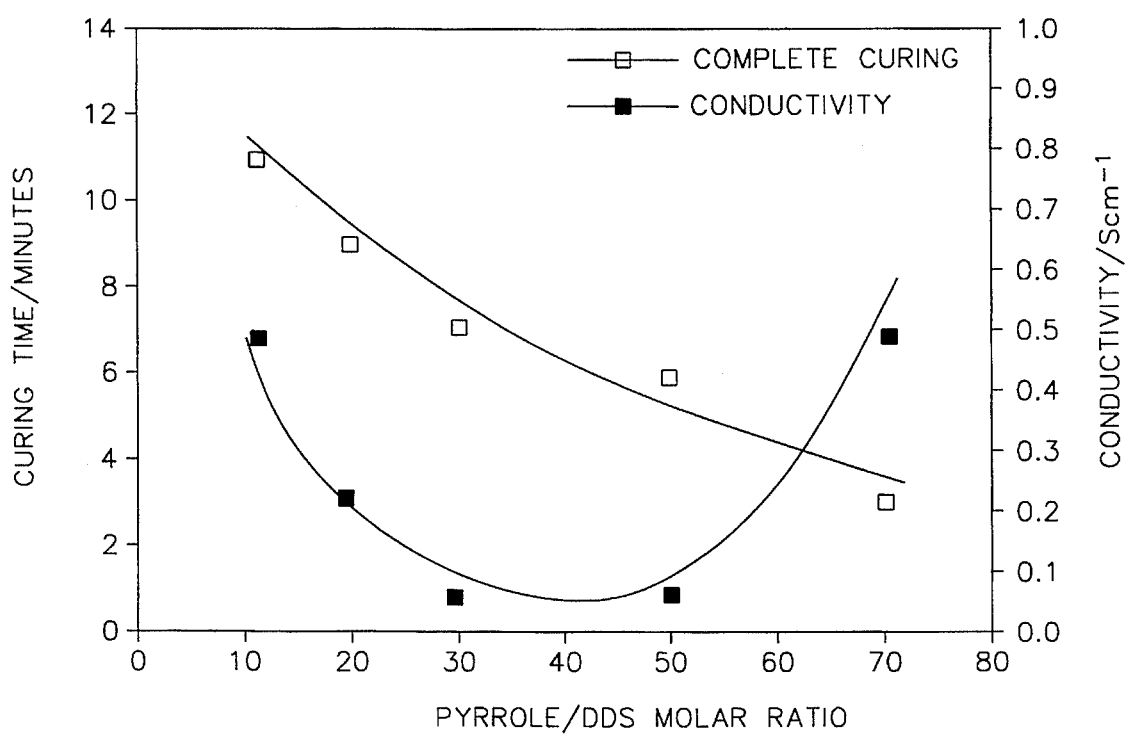
FIG. 6 is a graph illustrating the dependence of curing time and conductivity on the amount of dodecyl sulfate used as flexibilizer.

FIGS. 5 and 6 show variations in curing time and conductivity of films photopolymerized with different concentrations of DDS additive. It was possible to follow the curing progress at two stages: corresponding to surface solidification and when curing was completed. Both plots exhibit the same slope, showing that the curing time is longer with increasing amounts of DDS in the films. Films with higher concentrations of surfactant additive became soft. The electrical conductivity of the films was within the range 0.1–0.5 S cm$^{-1}$. A minimum in electrical conductivity, evident at ratios between 30:1 to 50:1, is probably due to an artifact in that the resistivity probe tips penetrated into the soft films at ratios greater than 30:1 and hence, displayed conductivity values higher than those for the films of measured thickness. It was found that films containing between 10:1 and 20:1 of pyrrole:DDS additive, possess the greatest flexibility and conductivity.

EXAMPLE 5

A series of experiments were performed to examine the electrical resistance of polymer films photopolymerized from mixtures of pyrrole and aniline monomers. Solutions of silver nitrate (AgNO$_3$), pyrrole, and aniline were prepared in one ml of acetonitrile. Equivalent molar amounts of AgNO$_3$ and various proportions of pyrrole and aniline were prepared in a large volume excess of acetonitrile (about 500 volume percent).

Figure 7:
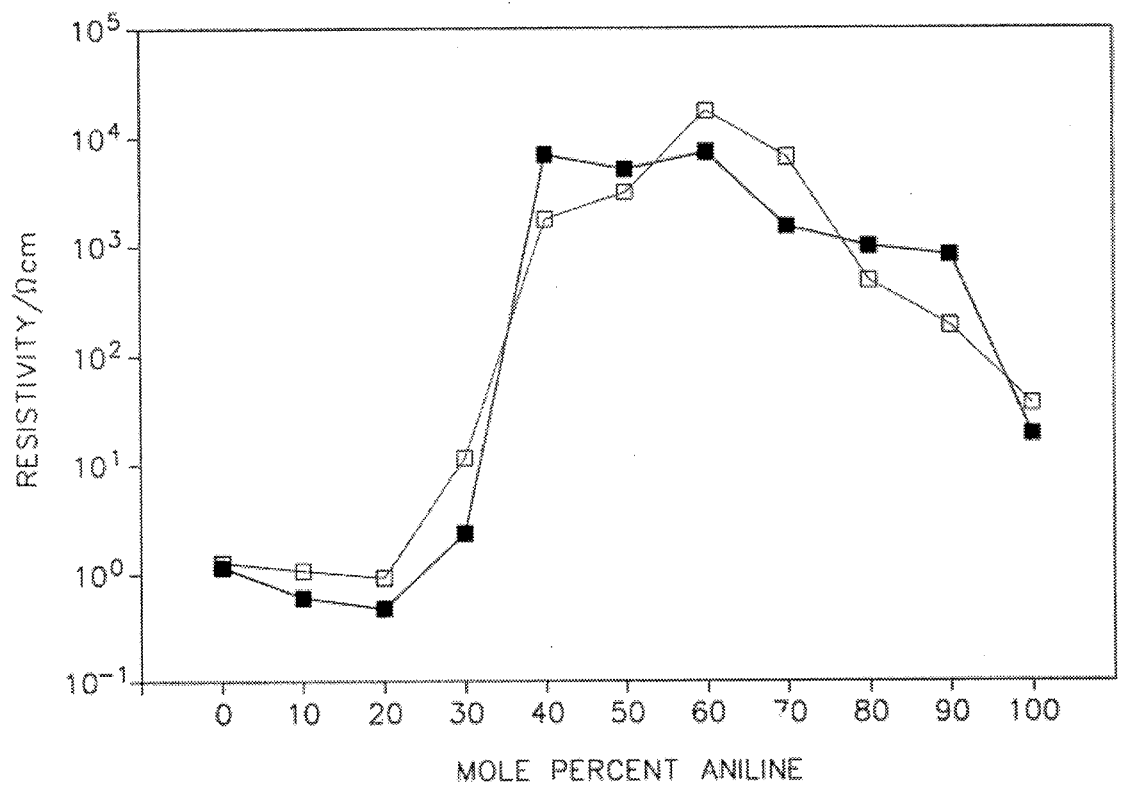
FIG. 7 is a graph illustrating the dependence of resistance of photopolymerized polypyrrole films on the ratios of pyrrole:aniline monomers.

The solutions were deposited with a brush to coat a masked ceramic alumina substrate and cured immediately. Two to three successive layers were built up on the alumina with a thickness between 20 and 160 microns. The polymer samples were cured in 1 sq cm areas and contacts for resistance measurements were drawn with a silver paint. Resistivity (Ω-cm) was calculated for each polymer film prepared in duplicate by the van der Pauw method. FIG. 7 shows the relationship between the pyrrole/aniline monomer ratio and resistivity of the resulting films.

The results show that the presence of a comonomer in the photopolymerization formulation can be utilized to change and/or control the resistance of the resulting mixed conducting polymer film. A maximum in resistance was obtained in the molar ratio range between about 35 and about 70 percent (%) of aniline present in the formulation. At higher ratios (>70%) the resistance decreased. Lowest resistances were found for films with little or no aniline present. However, polymer films with aniline present in the formulation exhibited smoother film surfaces. The same results were obtained using fiber-glass epoxy and polyimide PWB substrates.

EXAMPLE 6

A series of experiments were performed under the conditions described in Example 5, for a various copolymer materials such as an aqueous acrylic resin, bisphenol A diglycidyl ether, and perfluorinated sulfonic acid. The results are given below in Table 4.

TABLE 4

CONDUCTIVITY OF PPY FILMS PHOTO-COPOLYMERIZED WITH
DIFFERENT RESINS (PYRROLE/AgNO$_3$ = 8:1; PHOTOINITIATOR: 3 wt %
IRGACURE 261; CURING: DIFFERENT CONDITIONS; AVERAGE 1.2 W
cm$^{-2}$; FOR ARALDITE, 2.1 W cm$^{-2}$ AND THERMAL POSTCURE AT 2.3 W cm$^{-2}$.

| COPOLYMER MATERIAL | % (w/w) OF COPOLYMER | THICKNESS mm | CONDUCTIVITY S cm$^{-1}$ | COMMENT |
|---|---|---|---|---|
| MAINCOTE HG 54 D | 50 (1:1) | | | no polym., yellow precipitate |
| MAINCOTE HG 54 D | 4 | 65 | 0.074 | black, smooth, max.copol.conc = 4 wt % |
| MAINCOTE HG 54 D | 4 | 119 | 0.072 | black, smooth, max.copol.conc = 4 wt % |
| ARALDITE 502 | 10 | 121 | 0.086 | black, smooth, flexible |
| | 14 | 74 | 0.022 | longer curing needed |

TABLE 4-continued

CONDUCTIVITY OF PPY FILMS PHOTO-COPOLYMERIZED WITH
DIFFERENT RESINS (PYRROLE/AgNO$_3$ = 8:1; PHOTOINITIATOR: 3 wt %
IRGACURE 261; CURING: DIFFERENT CONDITIONS; AVERAGE 1.2 W
cm$^{-2}$; FOR ARALDITE, 2.1 W cm$^{-2}$ AND THERMAL POSTCURE AT 2.3 W cm$^{-2}$.

| COPOLYMER MATERIAL | % (w/w) OF COPOLYMER | THICKNESS mm | CONDUCTIVITY S cm$^{-1}$ | COMMENT |
|---|---|---|---|---|
| (on polystyrene) | 20 | 159 | 0.0092 | at high lamp power |
| (on glass) | 14 | 41 | 0.063 | t > 10–15 min/layer |
|  | 20 | 20 | 0.044 | " |
|  | 34 | 14 | 0.015 | " |
|  | 51 | 12 | 0.0068 | " |
| NAFION | 5 | 64 | 0.53 | black, smooth, flexible |
|  | 10 |  |  | too resistive, voltage transients show saturation |

The waterborne acrylic resin did not undergo successful copolymerization with pyrrole. It was possible to make a film only if it was added at amounts less than 4 wt %, however, resulting in reduced conductivity. Acrylic resins undergo very little cationic polymerization (mostly radical induced), which is incompatible with the photo-polymerization of pyrrole.

Copolymerization of pyrrole with bisphenol A diglycidyl ether, which undergoes a cationic photopolymerization mechanism, resulted in good films covering a large range of pyrrole/copolymer ratios from 10:1 to 1:1. It may be noted that on using the ferrocinium photoinitiator and bisphenol A diglycidyl ether alone, a yellow nonconducting film was obtained. Conductivities of PPY/epoxide copolymers were approximately an order of magnitude lower than that of PPY films without a copolymer. Increasing the amount of epoxy copolymer up to a ratio of 1:1 resulted in an order of magnitude decrease in conductivity as shown in Table 4. PPY/epoxide copolymers possessed good flexibility and exhibited softness, the latter increasing with higher amounts of epoxide copolymer added. Also, these films adhered very well to metallic and nonmetallic substrates, and it was difficult to peel them off, partly due to their softness.

Photocopolymerization with relatively low concentrations of perfluorinated sulfonic acid appeared to be successful, and high electronic conductivities were retained. At higher concentrations of Nation copolymer (10 wt %), the conductivity values were irreproducible and decreased, indicating a structure of mixed conducting pyrrole and nonconducting (or ionically conducting) Nafion.

EXAMPLE 7

A test was performed using a high resolution laser and an electron-beam for the patterning of conducting polypyrrole lines.

Figure 8:
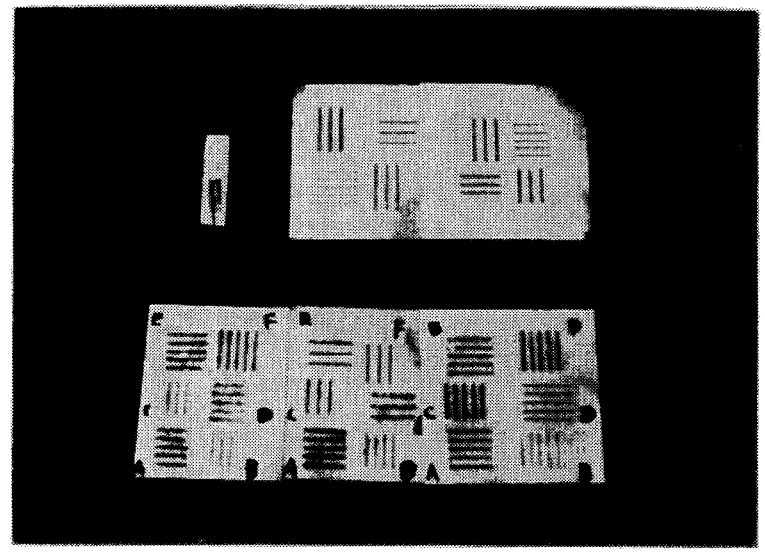
FIG. 8 is a photograph of alumina substrates with laser patterned lines of electronically conducting polypyrrole.

Referring now to FIG. 8, alumina substrates, (bottom row, one inch by one inch substrates), have laser patterned lines formed from a 4:1 pyrrole:silver nitrate formulation spun at 500, 300, and 1000 RPM, respectively. Each alumina substrate contains several sets of 3–5 lines obtained with a different number of laser beam passes. Alumina substrates shown in the top row (one inch by one inch substrates) have laser patterned lines using a 8:1 pyrrole:silver nitrate formulation spun at 500 and 1000 RPM, respectively. The small alumina substrate has a patterned line formed from a 4:1 pyrrole:silver nitrate formulation photopolymerized by a 10 nm wide electron beam. Each of the formulations contained acetonitrile.

The parameters (beam current, beam sweep rate, number of passes) were varied for each set of exposures to test the photopolymerization process. Line widths obtained using argon ion laser imaging were ca 100 microns.

An electron beam was used to fabricate both narrow lines (down to 1.5 microns wide) and wide lines (80 microns wide), using the same exposure parameters, but two different techniques. The narrow lines were fabricated using a step and repeat technique, (i.e. the electron beam was moved across the sample and the sample moved between exposures) to form a number of parallel lines with approximately equal linewidths and spacing. The wide lines were fabricated by exposing narrow lines together (side by side), with sufficient overlap to eliminate any visible rastering under SEM examination.

EXAMPLE 8

Figure 9A:
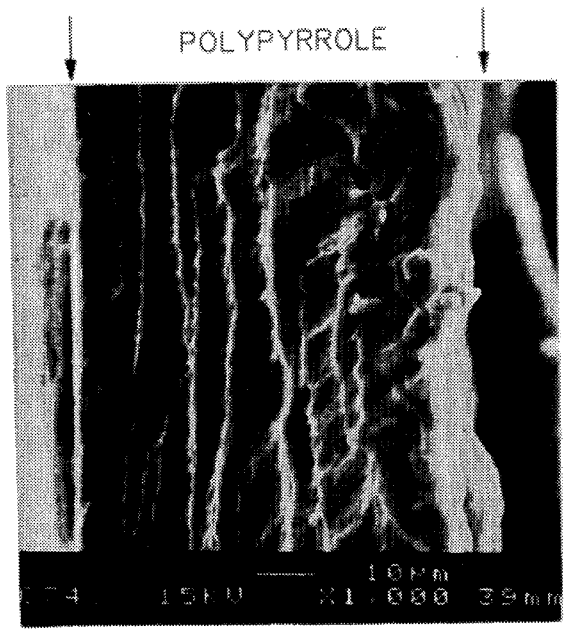
FIG. 9 contains scanning electron micrographs of the cross-sections of polypyrrole films formed electrochemically and photochemically.
Figure 9B:
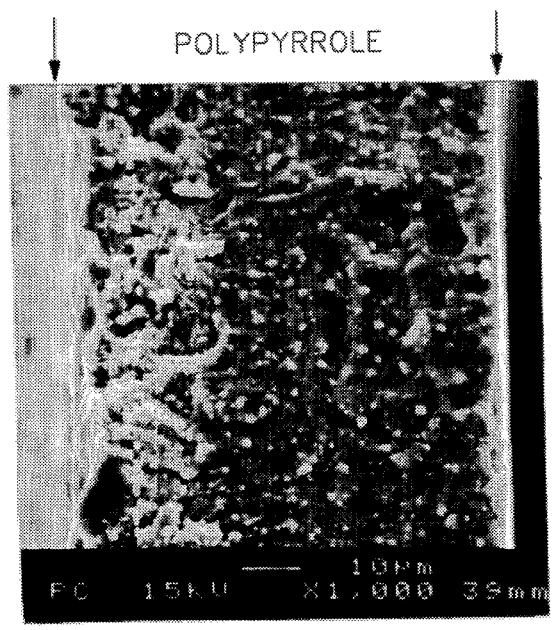
Figure 10A:
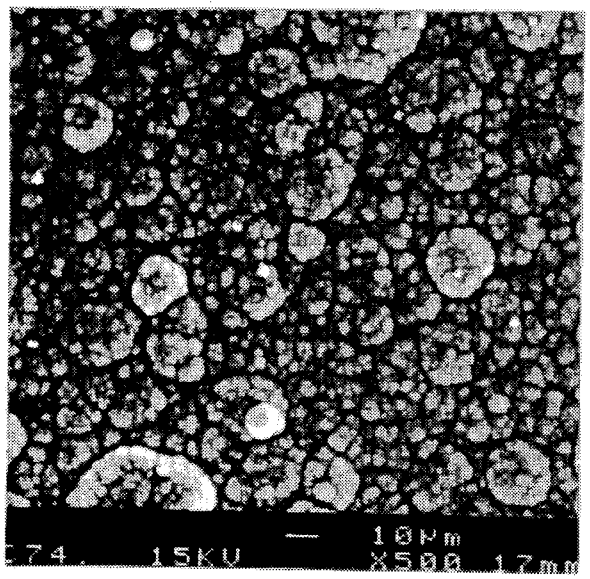
FIG. 10 contains scanning electron micrographs of the surfaces of polypyrrole films formed electrochemically and photochemically.
Figure 10B:
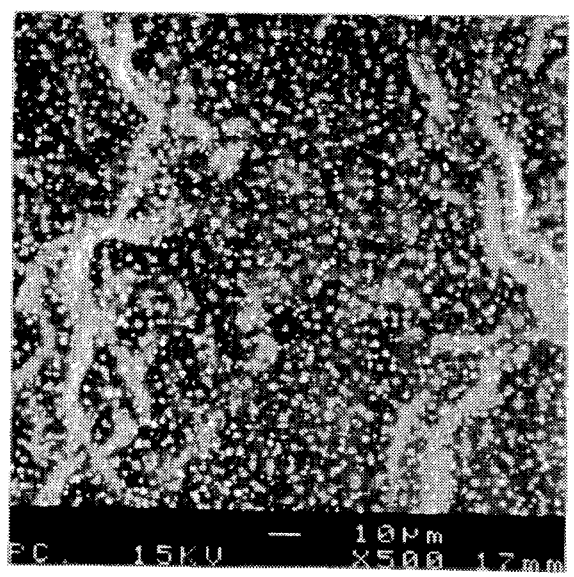
Figure 10C:
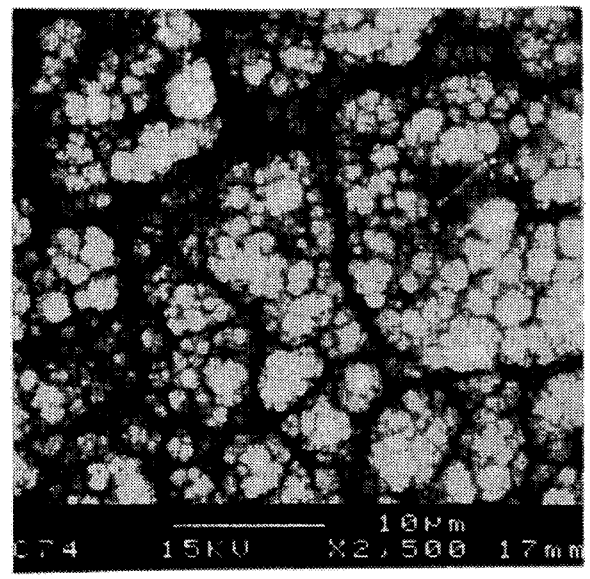
Figure 10D:
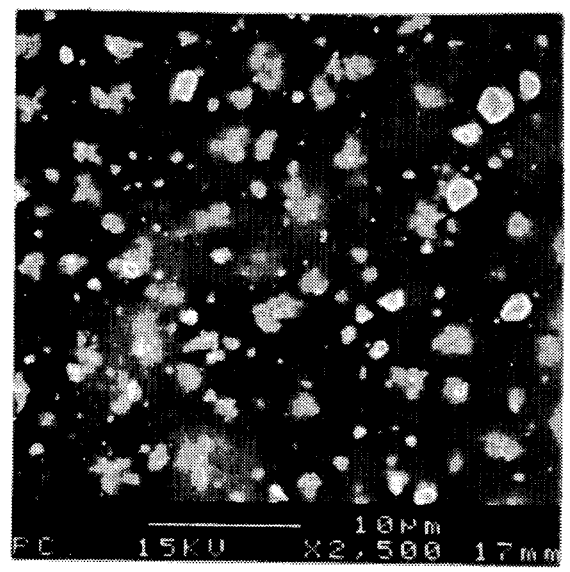

Scanning electron micrographs of fracture surfaces of thick photopolymerized (70 micron) and electropolymerized (67 micron) polypyrrole films are shown in FIG. 9. It can be seen from FIG. 9(a) that electrochemically prepared polypyrrole is dense, non-fibrillar and volume-filling. The photopolymerized polypyrrole material of FIG. 9(b) is surprisingly compact, but more open-structured and contains some voids.

Scanning electron micrographs at two magnifications of the outer surfaces of electropolymerized and photopolymerized polypyrrole films are presented in FIG. 10. Now referring to FIGS. 10(a) and 10(c), an electrochemically prepared polypyrrole is shown to have nodular or "cauliflower" structures that are consistent with a nucleation/dendritic film growth mechanism. This surface topology is frequently observed for electrochemically prepared polypyrrole materials. In contrast, the surface topography for the photopolymerized polypyrrole films shown in FIGS. 10(b) and 10(d) was rather featureless, being smooth and flat. As observed in the micrograph of the fractured surface of photopolymerized PPY in FIG. 9(b), a large number of evenly distributed Ag grains of surprisingly uniform size can be seen also on its outer surface. In the higher magnification electron micrograph FIG. 10(d), the bright, reflective, spherical Ag particles were determined to be 1 μm or less in diameter. Also in this micrograph, the microporous structure of the photopolymerized film can be clearly seen. For both polypyrrole film types, the surfaces adhering to the substrates were smooth, shiny and featureless.

PRINTED WIRING BOARDS

The present photopolymerization process is ideally suited for the preparation of conducting polymers as a direct metallization method for PWB production. A novel process for the production of double-side printed wiring boards, which involves photopolymerization of conducting polypyrrole (or its derivatives), require only a few production steps consisting of:

(i) cleaning of a PWB substrate, drilling and deburring of holes;
(ii) application of photopolymerizable formulation;
(iii) formation of a dry negative photopolymerizable resist by air-drying;
(iv) exposure by UV light through a contact mask or by direct laser imaging. This step renders irradiated regions insoluble in a corresponding solvent, thus forming future current carrying lines; both conductor lines and walls of through-holes are photopolymerized and become conductive;
(v) non-irradiated areas of the photopolymerizable film are washed off in a development process using benign chemicals such as acetone or water;
(v) sensitization of conducting polymer lines and through-holes by dipping in a noble metal salt solution; and
(vi) electrodeposition of copper from acidic sulfate baths.

Once the desired conducting polymer patterns have been formed (steps i–iv), additional steps must be taken to form a PWB. First, the conducting polymer is sensitized by immersion in a noble metal salt solution where the noble metals undergo spontaneous deposition onto the conducting polymer. The process of sensitizing increases the conductivity of the polymer lines sufficiently to allow subsequent electrodeposition of copper using conventional techniques. The preferred metals are Palladium (Pd), Gold (Au), Copper (Cu) and Silver (Au). The most preferred solution for sensitizing the conducting polymer is a 0.01M aqueous palladium bromide ($PdBr_2$) solution.

Electrodeposition is typically performed in a copper sulfate bath (0.3M $CuSO_4$, pH=2.0). A cathodic current of about 100 mA is applied to the electronically conducting polymer on the substrate with an aligator clip. Under these conditions, a bright copper film can be seen continuously growing outward from the clip along the conducting polymer lines. Over time, the copper layer will cover the entire surface of the conducting polymer lines and the layer will become thicker.

A new electroplating apparatus capable of plating photopolymerized conducting polymer patterns has been designed which includes a rolling cylinder cathode for contacting the conducting polymer lines deposited on the board. As compared to a stationary cathode in contact with a discrete point on the conducting polymer lines, the rolling cathode would provide a more evenly distributed conductor layer.

Direct laser writing is usually a time consuming process, e.g., as in making photomasks, but in the proposed process many of the production steps are avoided. It is possible that this process could help build interconnecting vias in multilayer and complex PWB manufacturing, such as in low-volume PWB production where high line resolutions are required.

Figure 11:
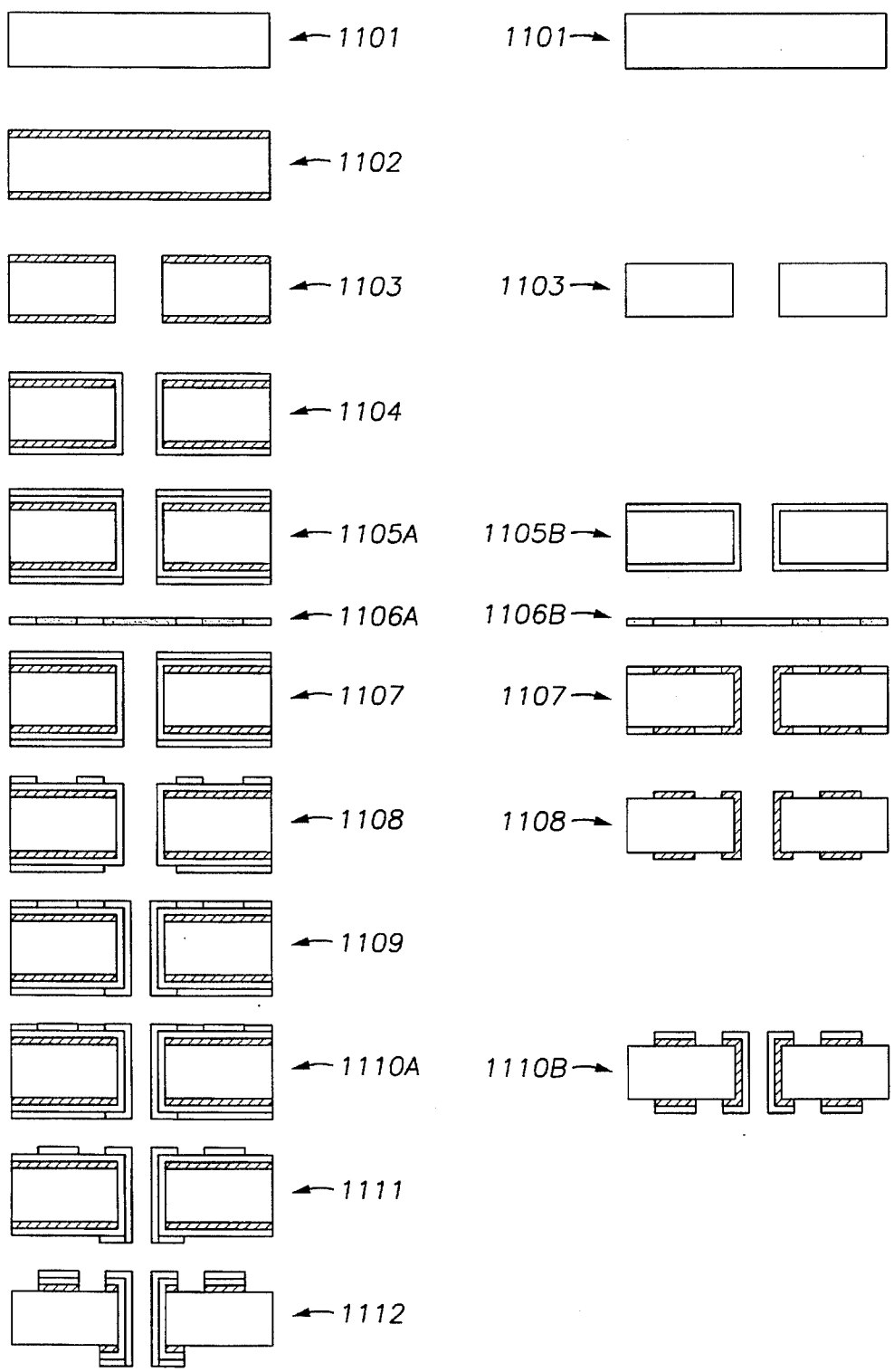
FIG. 11 is a flow chart comparing the steps of conventional PWB fabrication with those of the present invention.

FIG. 11 compares the basic steps of a conventional subtractive process and the direct metallization process of the present invention based on photopolymerization of conducting polymers for the production of double-sided printed wiring boards. The additive process differs from the subtractive process in that no eching is required and the circuit pattern is defined at the same time that through-hole connections are made.

The process of the present invention is an additive process which utilizes direct metallization of through-holes and conductors. Attractive features of the proposed direct metallization process for PWB fabrication are that many steps, normally required in conventional processes, which are labor intensive or produce difficult to treat hazardous waste, are avoided. The steps avoided by the present invention include: (i) copper-foil lamination onto insulators; (ii) sensitization of the entire board surface; (iii) electroless copper plating, and (iv) lift-off of the photoresist and surplus copper (foil) layer. If the PWB is to be through-hole plated, hole walls will be coated with a layer of photopolymerizable material in the same step as a dry-film is formed on the surface of the PWB substrate. The subsequent copper electrodeposition step will be the same as in conventional processes, except that the deposition bath will be optimized for deposition onto a polypyrrole surface.

EXAMPLE 9

Figure 12:
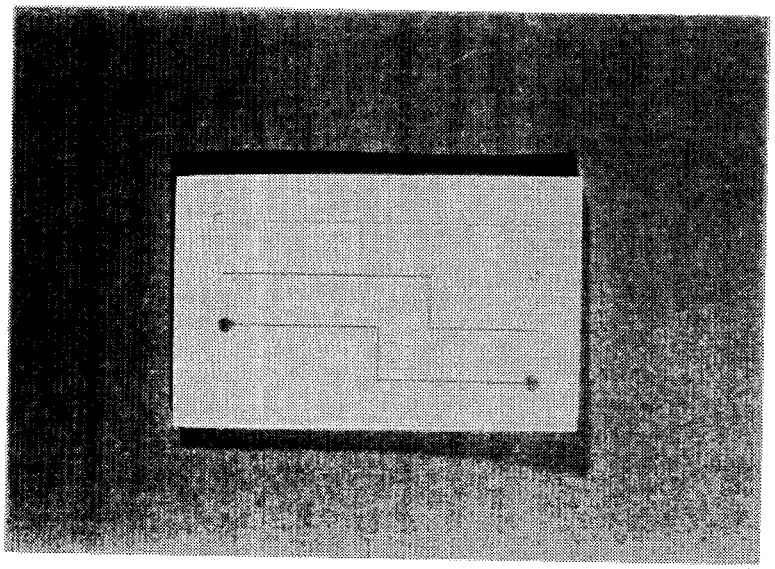
FIG. 12 is a photograph of black conducting polypyrrole lines on a fiberglass/epoxy PWB substrate patterned using UV illumination through a shadow mask, wherein one line has been electrodeposited with copper.

A photograph of conducting polymer lines obtained by the photopolymerization process and a line electrolytically coated with copper after sensitization by dipping in a Pd containing solution is presented in FIG. 12. Phtopolymerization conditions were optimized in terms of line conductivity and line resolution, and comprised using pyrrole and aniline as monomers, and cationic ferrocinium photoinitiator (IRGACURE™ 261 available from Ciba Geigy, located in Ardsley, N.Y.) in the starting photopolymerization solution. Other experimental conditions were as follows: fiberglass epoxy substrate; illumination with a UV lamp (Hg/Xe lamp, 81 mW/$cm^2$) through a shadow mask; line thickness of 0.01"; line spacing of 0.2"; photopolymerizable formulation consisted of 15 mM pyrrole, a pyrrole/silver nitrate molar ratio of 8:1; 15 mole percent aniline; photoinitiator concentration of 0.2 weight percent, and acetone washing solvent. Sensitization was performed in 0.01M $PdBr_2$ solution, and electrodeposition in a typical copper sulfate bath (0.3M $CuSO_4$, pH=2.0).

EXAMPLE 10

Figure 13:
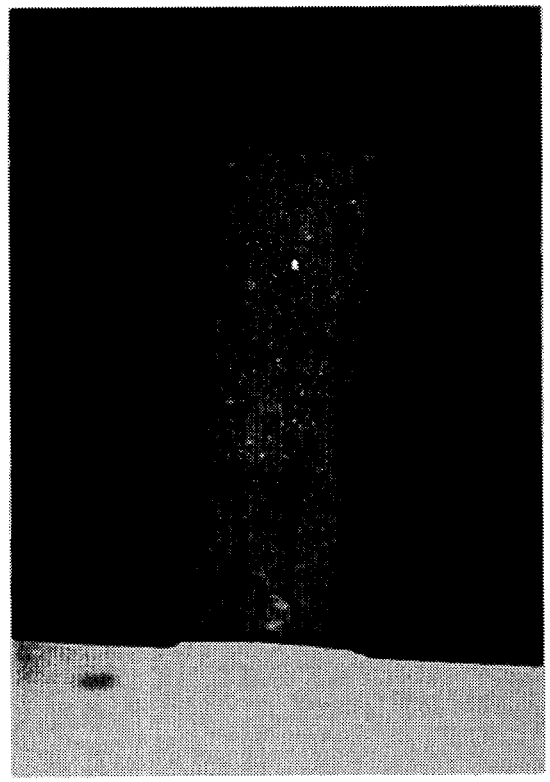
FIG. 13 is a photograph of a copper-on-polypyrrole plated 0.025 inch diameter through-hole.

Through-hole plating using a photopolymerized conducting polymer film as a substrate for electrodeposition of copper is shown in FIG. 13.

Both polymer and Cu-coated polymer lines passed the scotch-tape peel-off test. Preliminary results on adhesion measurements (using diamond scratch test, Universal Adhesion Tester) performed on polymer/substrate and copper/polymer interfaces showed adhesion at both interfaces to be satisfactory for application in PWB manufacturing.

The present photopolymerization process for the synthesis of conducting polymers can be implemented in: (a) high-volume automated PWB manufacturing using UV irradiation through a contact mask applied to photopolymerizable dry-films, and (b) low volume manufacturing of complex, multilayer PWBs by direct laser imaging (DLI). The present invention is uniquely suited for adaptation to an automated PWB manufacturing process, utilizing mostly standard equipment already developed at PWB manufacturing facilities.

The process does not use copper foil laminate, because a conducting polymer is photopolymerized directly on the PWB substrate. Further, no electroless copper and noble metal plating steps are necessary, which brings additional cost savings. Because an electroless copper plating step is avoided, the new process does not require hazardous waste treatment from electroless plating baths, e.g. formaldehyde and metal complexes. Cost savings will be realized due to a reduction in direct labor costs, chemical costs, floor space requirements, lab analysis, ventilation requirements, etc.

However, the primary advantage of the present photopolymerization process is that photopolymerized films can incorporate controlled amounts of anions, or additives during the photopolymerization process, in addition to anions needed for charge balance in the films. This opens up new perspectives in designing conducting polymer films, thus controlling desirable properties in the films. This is not possible in electropolymerizations where only anions in amounts needed for charge balance are incorporated into conducting polymer films. Addition of surfactant additives to monomer solutions containing other anions for electropolymerization may cause blocking of the electrode surface and thus prevent electropolymerization from taking place.

It will be understood that certain combinations and subcombinations of the invention are of utility and may be employed without reference to other features in subcombinations. This is contemplated by and is within the scope of the present invention. As many possible embodiments may be made of this invention without departing from the spirit and scope thereof, it is to be understood that all matters hereinabove set forth or shown in the accompanying drawings are to be interpreted as illustrative and not in a limiting sense.

What is claimed is:

1. A method of forming an electronic circuit on a substrate comprising the steps of:

forming a solution comprising a pyrrole monomer and an electron acceptor;

applying a film of the solution onto the substrate;

photopolymerizing portions of the film to form electronically conducting polypyrrole;

washing an unpolymerized portion of the film from the substrate;

activating the polypyrrole with aqueous palladium bromide; and electrodepositing a metal onto the activated polypyrrole.

2. The method of claim 1 wherein the substrate is nonconducting.

3. The method of claim 1 wherein the electron acceptor is a silver salt.

4. The method of claim 3 wherein the silver salt is selected from the group consisting of $AgNO_3$, $AgClO_4$ and $AgNO_2$.

5. The method of claim 3 wherein the silver salt is $AgNO_3$.

6. The method of claim 1 wherein the film further comprises a photoinitiator.

7. The method of claim 1 wherein the film further comprises a comonomer.

8. The method of claim 7 wherein the comonomer is aniline.

9. The method of claim 8 wherein the metal is selected from the group consisting of copper, silver, gold, nickel, and mixtures thereof.

10. The method of claim 1 wherein the metal is copper.

11. A method of direct plating through-hole walls in a printed circuit board comprising the steps of:

forming a solution comprising a pyrrole monomer and an electron acceptor;

applying a film of the solution onto the through-hole walls;

photopolymerizing the film to form electronically conducting polypyrrole;

washing an unpolymerized mixture off the board;

activating the polypyrrole with aqueous palladium bromide; and electrodepositing a metal onto the activated polypyrrole.

12. The method of claim 11 wherein the printed circuit board comprises top and bottom surfaces current carrying copper lines on a nonconducting substrate.

13. The method of claim 11 wherein the through-hole walls are nonconducting.

14. A direct metallization process for manufacturing a printed circuit board from a substrate having a top surface and through-holes walls therein, comprising the steps of:

forming a solution comprising a pyrrole monomer and an electron acceptor;

applying a film of the solution onto the top surface and a through-hole wall of the substrate;

photopolymerizing portions of the film to form electronically conducting polypyrrole on the surface and the through-hole wall;

washing an unpolymerized portion of the film off the substrate;

activating the polypyrrole with aqueous palladium bromide; and electrodepositing a metal onto the activated polypyrrole.

15. The method of claim 14 wherein the substrate is nonconducting.

16. The method of claim 15 wherein the portion of the film that is photopolymerized includes all of the through-holes.

17. The method of claim 14 wherein the film further comprises a photoinitiator.

18. The method of claim 14 wherein the film further comprises a comonomer.

19. The method of claim 14 further comprising the step of:

curing the polypyrrole at a temperature between about 25 and about 100 degrees Celsius for a period of time between about 0.1 and about 3 hours in air.

* * * * *

UNITED STATES PATENT AND TRADEMARK OFFICE
CERTIFICATE OF CORRECTION

PATENT NO. : 5,545,308
DATED : August 13, 1996
INVENTOR(S) : Oliver J. Murphy, et al.

It is certified that error appears in the above-identified patent and that said Letters Patent is hereby corrected as shown below:

Column 1, 1st paragraph, change paragraph to read --This invention was made with Government support under contract NAS3-26998 awarded by NASA. The Government has certain rights in this invention.--

Signed and Sealed this

Sixth Day of March, 2001

NICHOLAS P. GODICI

*Attest:*

*Attesting Officer*

*Acting Director of the United States Patent and Trademark Office*